(12) United States Patent
Shong

(10) Patent No.: US 7,663,384 B2
(45) Date of Patent: Feb. 16, 2010

(54) METHOD AND APPARATUS FOR MEASURING METALLIC AREA-SPECIFIC RESISTANCE

(75) Inventor: Wei-Ja Shong, Taoyuan County (TW)

(73) Assignee: Atomic Energy Council, Taoyuan (TW)

( * ) Notice: Subject to any disclaimer, the term of this patent is extended or adjusted under 35 U.S.C. 154(b) by 259 days.

(21) Appl. No.: 11/892,411

(22) Filed: Aug. 22, 2007

(65) Prior Publication Data

US 2009/0051375 A1    Feb. 26, 2009

(51) Int. Cl.
G01R 27/08 (2006.01)
(52) U.S. Cl. .................................. 324/722
(58) Field of Classification Search ............... 324/722; 438/11, 14, 17
See application file for complete search history.

(56) References Cited

U.S. PATENT DOCUMENTS

2006/0046037 A1*  3/2006  Friend et al. ............. 428/212

* cited by examiner

*Primary Examiner*—Timothy J Dole
*Assistant Examiner*—Benjamin M Baldridge
(74) *Attorney, Agent, or Firm*—Jackson IPG PLLC

(57) ABSTRACT

A simple method and apparatus for measuring the low area specific resistance of a metal plate, particularly in high temperature (<962° C.) environment, are provided. The metal plate, which may include a coating, is used in high temperature environment for electric conduction. Silver paste is applied on the metal surface. Paste sintering processes to minimize contact resistance are described. These sintering processes cause negligible change to the original metal condition, thus accurate and precise area specific resistivity of the metal plate can be obtained.

10 Claims, 4 Drawing Sheets

METHOD AND APPARATUS FOR MEASURING METALLIC AREA-SPECIFIC RESISTANCE

BACKGROUND OF INVENTION

1. Field of Invention

The present invention relates to a method and apparatus for measuring the area specific resistance of a metal plate, particularly of low resistivity at high temperatures, with negligible change to the original plate properties.

2. Related Prior Art

To measure the area specific resistance of a metal plate at high temperatures, platinum paste, as a contact electrode, is applied on the metallic surface. Platinum paste is however expensive. Moreover, in the temperature range for the measurement, the degree of the sintering of the platinum particles is low so that the resistance of the platinum paste cannot be minimized and that the platinum particles cannot be firmly attached to the metallic surface. Therefore, the precision of the measurement is affected, particularly when the resistance to be measured is very low.

There are alternative measuring methods such as using a platinum mesh, together with platinum paste or alone, or using a mesh made of other noble metal. The platinum paste suffers the above-mentioned drawbacks. The platinum mesh or the mesh made of other noble metal cannot be firmly attached to the plate surface. There is an attempt to firmly attach the mesh to the plate surface by exerting pressure on the mesh against the plate surface. This however could easily damage the plate surface condition like coating or pre-oxidized scale, and induce errors to the measurement. In addition, the contact area between the mesh and the plate surface can not be accurately determined. Therefore, the above-mentioned methods for measuring the metallic area specific resistance cannot meet the need of precise measurement.

The present invention is therefore intended to obviate or at least alleviate the problems encountered in prior art.

SUMMARY OF INVENTION

The primary objective of the present invention is to precisely measure the area specific resistance of a metal plate with very little damage to the same.

According to the present invention, a method and apparatus is provided for measuring the area specific resistance of a metal plate in the temperature range below the melting point of silver (962° C.). As a general case for describing this invention, a metal plate includes a top surface with special surface treatment and a back surface of original fresh metal. Silver paste is applied on the top surface of the metal plate. The silver paste is dried and molded into a desired shape. The dried silver paste is sintered at a temperature close to the melting point of silver, for example 960° C., and turned into a silver foil, forming non-porous contact with the top surface of the metal plate. The back surface of the metal plate is polished. First and second wires are connected to the silver foil by a silver paste drop. Third and fourth wires are spot welded to the second surface of the metal plate within the covered area right under the silver foil. The first and third wires are connected to the positive and negative electrodes of a power supply, respectively. The second and fourth wires are connected to the positive and negative electrodes of the voltmeter, respectively. A current I is provided from the power supply. The temperature of the metal plate is first raised to a suitable point not close to the melting point of silver, for example 800° C., for sintering the silver paste drop attaching the first and second wires. Then the temperature is adjusted and retained at the point according to the practical applications for measurement. The voltage V is read from the voltmeter. A digitized image of the silver foil is acquired and the area A of the silver foil is calculated. The area specific resistance of the first surface of the metal plate is calculated based on the voltage V, the current I and the area A of the silver foil as V/(I/A).

Other objectives, advantages and features of the present invention will become apparent from the following description referring to the attached drawings.

BRIEF DESCRIPTION OF DRAWINGS

The present invention will be described via detailed illustration of the preferred embodiment referring to the drawings.

DETAILED DESCRIPTION OF PREFERRED EMBODIMENT

Figure 1:
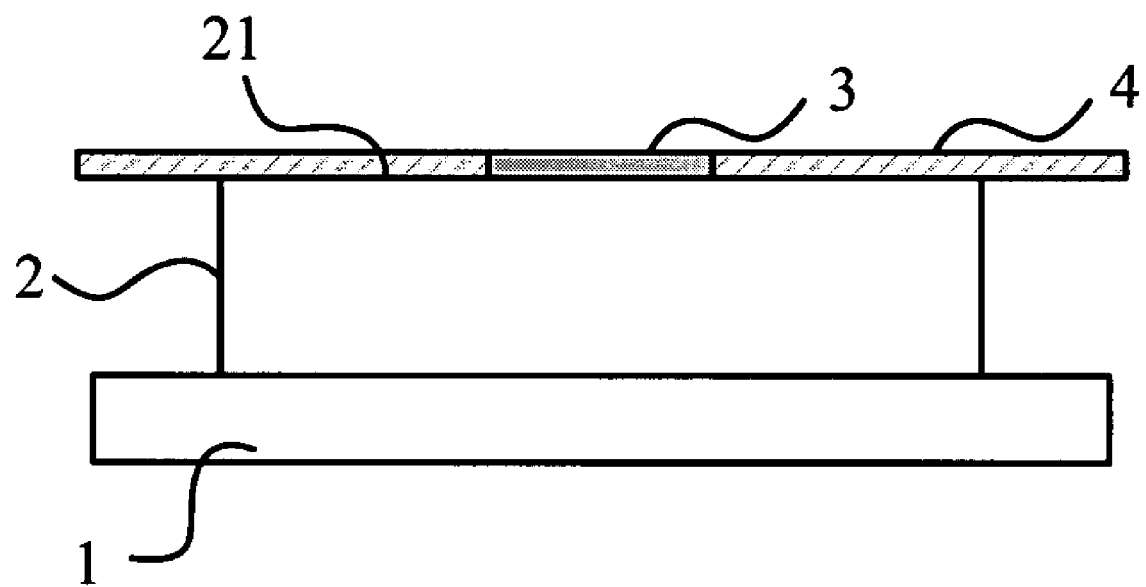
FIG. 1 is a cross-sectional view of silver paste filled in a template mold placed on the top surface of a metal plate located on a substrate according to the preferred embodiment of the present invention.
Figure 2:
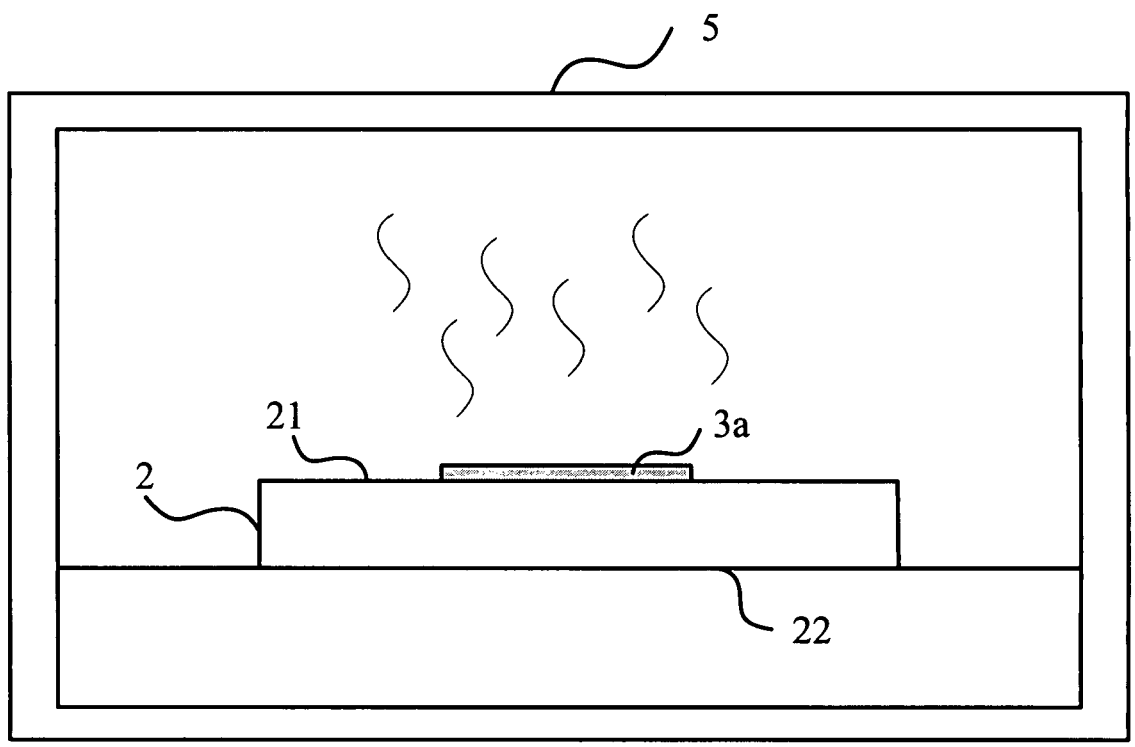
FIG. 2 is a cross-sectional view of an oven containing dried and molded silver paste, the metal plate and the substrate shown in FIG. 1.
Figure 3:
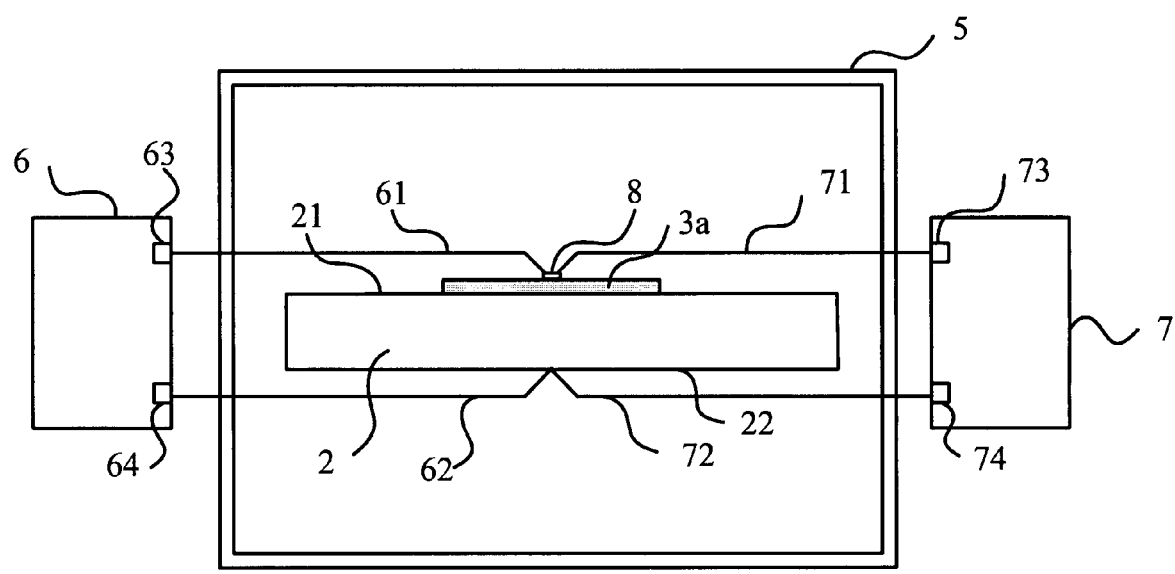
FIG. 3 is a cross-sectional view of a power supply and a voltmeter connected to the silver foil and the metal plate shown in FIG. 2.
Figure 4:
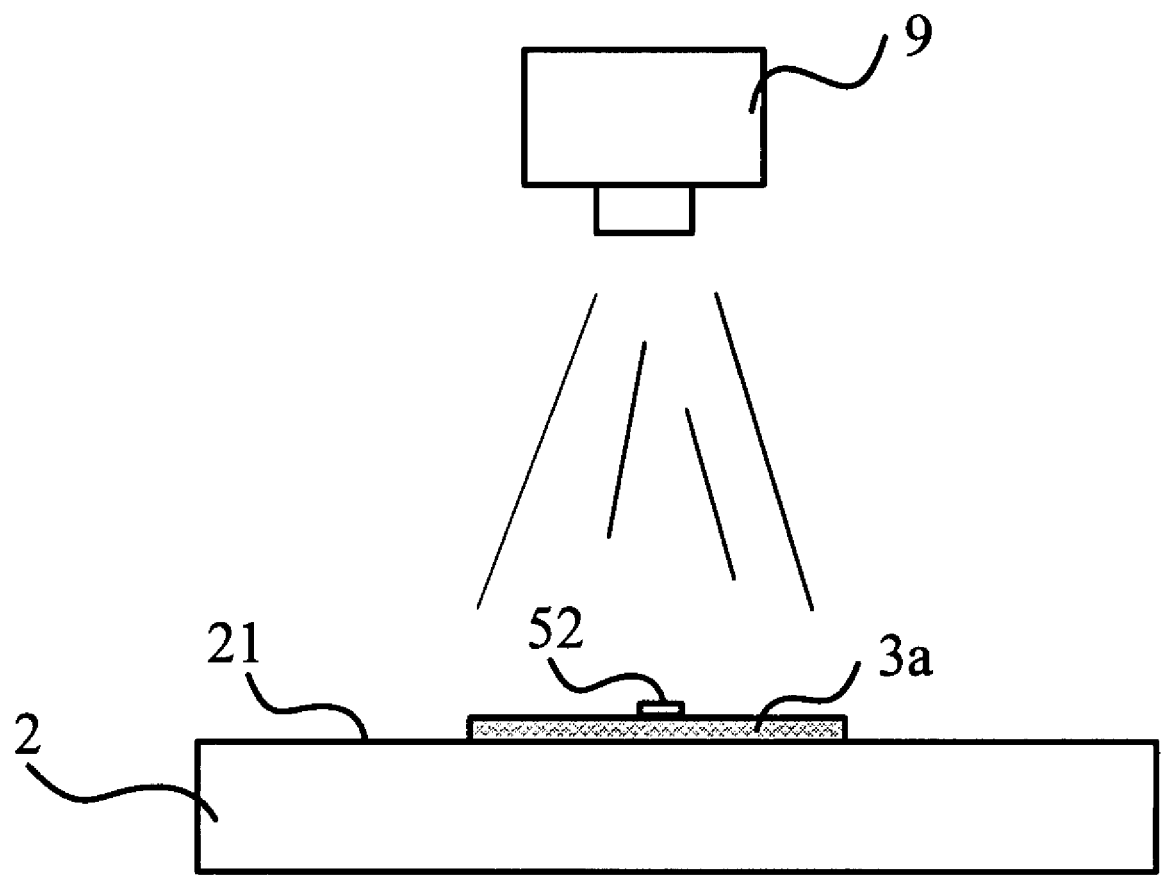
FIG. 4 is a side view of a camera for taking a photograph of the silver foil shown in FIG. 3.

Referring to FIGS. 1 through 4, there is shown a method and apparatus for measuring the area specific resistance of a metal plate of resistivity in the range of $1 \times 10^{-4}$ ohm-cm to $1 \times 10^{-3}$ ohm-cm according to the preferred embodiment of the present invention, particularly also applicable at high temperatures below the melting point of silver (962° C.). The metal plate is specifically made of high-temperature resistant alloys or steels which can survive without major material or physical or chemical property deterioration even over 1000° C. The metal plate is mainly used in the high-temperature environment (above 700° C.) for electric conduction. The area specific resistance of the metal plate can be measured precisely while the metal plate suffers very little property change through this measurement process.

Normally the plate surfaces must be polished, clean and smooth. There may be special surface treatment like coating or pre-oxidation on one or both surfaces of the metal plate. In such cases, polishing may not be necessary. The plate thickness and the surface condition should be determined by the user according to the practical application. For example, in the application of solid oxide fuel cell (SOFC) stacks, generally operated at temperatures in the range of 750° C. to 850° C., the metal plate thickness is 2-3 mm, used as interconnect. In the SOFC stacks, the interconnect surface exposing to the oxidizing atmosphere is coated with conductive oxides. The opposite surface exposing to the reductive atmosphere remains the original fresh metal status.

A metal plate 2 is located on a substrate 1. A template mold 4 is placed on the surface with special surface treatment of the metal plate 2 (hereinafter referred to as the "top surface 21" for briefness). The template mold 4 is made of a material that survives a temperature at which silver paste is generally dried and molded. A proper amount of silver paste 3 is applied on the top surface 21 of the metal plate 2, within the aperture defined in the template mode 4. Thus, a layer of silver paste is applied. The substrate 1 is preferably a ceramic substrate that survives high temperature operations.

The metal plate 2 is disposed in an oven 5, for example at 120° C. for 10 minutes, where the silver paste 3 is dried and molded.

The template mode 4 is removed. The temperature in the oven 5 is raised to 960° C., or a point close to the melting point of silver (962° C.), at least above 930° C. The temperature in the oven 5 is retained at this point for 1 hour, or a pre-determined period of time more than 30 minutes, so that the silver paste 3 is sintered and turned into a silver foil 3a, forming non-porous contact with the top surface 21 of the metal plate 2 while causing very little damage to the top surface 21 of the metal plate 2.

The oven 5 is cooled down. The metal plate 2 includes a back surface 22 that is not specially treated but remains the original bulk metal. The back surface 22 is polished. With a spot welding machine, wires 62 and 72 are connected to the back surface 22 within the covered area right under the silver foil 3a of the metal plate 2.

In the oven 5, wires 61 and 71 are attached to the silver foil 3a by a silver paste drop 8. The wires 61 and 62 are connected to the positive and negative electrodes 63 and 64 of a power supply 6, respectively. The wires 71 and 72 are connected to the positive and negative electrodes 73 and 74 of a voltmeter 7, respectively. The wires 61, 62, 71 and 72 are made of a material of low resistance, such as Ag, Au, Pt, or Ni—Cr alloys, most preferably Au, and survive temperatures of following operations: the 800° C., 30 minute sintering process and the measuring temperature determined by the user based on the practical application condition.

A current I is provided by the power supply 6. The temperature of the metal plate 2 is increased to 800° C. The temperature of the metal plate 2 is retained at this point for 30 minutes so that the silver paste drop 8 is sintered and that the silver paste drop 8 is firmly attached to the silver foil 3a. The temperature in the oven 5 is set at a point determined by the practical application for measurement. For example, in the SOFC application, the temperature is 750° C. The temperature in the oven 5 is retained at the point for measurement for a pre-determined period of time. This period depends on the temperature controlling ability of the oven. For example, if the oven temperature can reach a stable condition within 1 minute, the retaining time can be 1 minute. When the voltage is stabilized, a reading V is acquired from the voltmeter 7.

After the oven 5 is cooled down, the metal plate 2 is removed from the oven 5. A digitized image of the silver foil 3a on the top surface 21 is taken by an optical instrument 9. The area A of the silver foil 3a is calculated by image analysis software.

The voltage V, the current I and the area A of the silver foil 3a are used to calculate the area specific resistance of the metal plate 2 as $V/(I/A)$. That is, the area specific resistance of the metal plate 2 is the ratio of the voltage drop between the top surface 21 and the back surface 22 to the surface current density passing through the top surface 21.

As discussed above, the method includes at least the step of applying the silver paste on the metallic surface, the step of drying and molding the silver paste, the step of sintering the silver paste into the silver foil, the step of polishing the reverse metallic surface, the step of attaching wires by silver paste drop and spot welding on both sides respectively, the step of determining the silver foil area, and the step of calculating the area specific resistance. Furthermore, the apparatus includes elements for conducting the steps of the method.

In conclusion, the drawbacks mentioned in RELATED PRIOR ART are overcome by the method and apparatus according to the present invention. The primary advantage of the method and apparatus for measuring metallic area specific resistance is the ability to precisely determine the area specific resistance of the metal plate with very little damage to the same.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A method for measuring the area specific resistance of a metal plate comprising the steps of:
   providing a substrate;
   providing a metal plate on the substrate, wherein the metal plate comprises a top surface with a surface treatment and a back surface of bare untreated metal;
   providing a template mold on the top surface of the metal plate;
   applying silver paste on the top surface of the metal plate within the template mold;
   providing an oven;
   heating the metal plate in the oven at 120° C. for 10 minutes so that the silver paste is dried and molded;
   removing the template from the top surface of the metal plate;
   increasing the temperature in the oven to 960° C., or a point close to the melting point of silver, at least above 930° C. and retaining the temperature in the oven at this point for 1 hour, or a pre-determined period of time more than 30 minutes, so that the dried silver paste is sintered and turned into a silver foil, forming non-porous contact with the top surface of the metal plate;
   polishing the back surface of the metal plate;
   attaching a first wire and a second wire to the silver foil by a silver paste drop;
   spot welding a third wire and a fourth wire on the back surface of the metal plate within the covered area right under the silver foil;
   providing a power supply;
   connecting the first and third wires to the positive and negative electrodes of the power supply, respectively;
   providing a voltmeter;
   connecting the second and fourth wires to the positive and negative electrodes of the voltmeter, respectively;
   providing a current I from the power supply;
   increasing the temperature of the metal plate to 800° C. and retaining the temperature of the metal plate at this point for 30 minutes so that the silver paste drop is sintered and firmly attached to the silver foil;
   adjusting the temperature of the metal plate to a point determined by the practical applications for measurement and retaining the temperature of the metal plate at the point for measurement for a pre-determined period of time, depending on the temperature controlling ability of the oven;
   reading the voltage V from the voltmeter;
   taking a digitized image of the silver foil and calculating the area A of the silver foil by image analysis software; and
   calculating the area specific resistance of the metal plate based on the voltage V, the current I and the area A of the silver foil as $V/(I/A)$.

2. The method according to claim 1, wherein the top surface on which the silver paste is applied is coated with a coating material, said material being metallic or non-metallic.

3. The method according to claim 1, wherein the substrate does not have a chemical interaction with the metal plate, silver paste, or conducting wire during the 960° C., 1-hr sintering process or during the 800° C., 30-min sintering process, or during the measuring temperature and duration which are determined by the user based on practical application conditions.

4. The method according to claim 1, wherein the wires are made of a material of low resistance and survive the 800° C., 30 minute sintering process and the measuring temperature lower than the melting point of silver, specifically determined by the practical application conditions, wherein the material of the wire is selected from the group consisting of Ag, Au, Pt, and Ni—Cr alloys.

5. The method according to claim 1, wherein the silver paste is made of silver with or without other metal additives.

6. The method according to claim 1, wherein the template mold survives the temperature at which the silver paste is dried and molded into the desired shape.

7. The method according to claim 1, wherein the silver paste is applied on the back surface of the metal plate using a template mold of the same aperture.

8. The method according to claim 7, wherein the silver paste on the back surface of the metal plate follows the same treatment and wiring process as done on the top surface.

9. The method according to claim 1, wherein the substrate material is ceramic.

10. The method according to claim 1, wherein the substrate material is aluminum oxide.

* * * * *